(12) United States Patent
Zha

(10) Patent No.: US 10,692,889 B2
(45) Date of Patent: Jun. 23, 2020

(54) THIN-FILM TRANSISTOR ARRAY SUBSTRATE AND METHOD OF MANUFACTURING THE SAME, AS WELL AS DISPLAY DEVICE

(71) Applicant: Wuhan China Star Optoelectronics Technology Co., Ltd., Wuhan, Hubei (CN)

(72) Inventor: Guowei Zha, Hubei (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 69 days.

(21) Appl. No.: 15/578,267

(22) PCT Filed: Nov. 21, 2017

(86) PCT No.: PCT/CN2017/112062
§ 371 (c)(1),
(2) Date: Nov. 30, 2017

(87) PCT Pub. No.: WO2019/085051
PCT Pub. Date: May 9, 2019

(65) Prior Publication Data
US 2019/0221587 A1 Jul. 18, 2019

(30) Foreign Application Priority Data

Oct. 31, 2017 (CN) .......................... 2017 1 1045672

(51) Int. Cl.
*H01L 27/12* (2006.01)
*G02F 1/1333* (2006.01)
*G02F 1/1368* (2006.01)

(52) U.S. Cl.
CPC ...... *H01L 27/1218* (2013.01); *H01L 27/1248* (2013.01); *H01L 27/1262* (2013.01);
(Continued)

(58) Field of Classification Search
CPC . H01L 27/1218; H01L 27/1262; H01L 33/20; H01L 33/22; H01L 27/1248; G02F 1/1333; G02F 1/1368; G02F 2201/07
See application file for complete search history.

(56) References Cited

U.S. PATENT DOCUMENTS

2005/0158639 A1* 7/2005 Yamaguchi ....... G02F 1/133553
430/20

FOREIGN PATENT DOCUMENTS

CN 103022231 A 4/2013
CN 103293811 A 9/2013
(Continued)

*Primary Examiner* — Thanhha S Pham
(74) *Attorney, Agent, or Firm* — Hemisphere Law, PLLC; Zhigang Ma

(57) ABSTRACT

The present invention is related to a field of display technology, and in particular to a thin film transistor array substrate, which comprises a glass substrate, as well as a buffer layer and a pixel structure layer disposed on a first surface of the glass substrate, wherein a plurality of patterned three-dimensional microstructures are formed on the first surface of the glass substrate, and the buffer layer and the first surface are mutually meshed. The present invention also discloses a method of manufacturing the array substrate mentioned above, and a display device comprising the array substrate. The thin film transistor array substrate provided by the present invention improves the light transmittance of the array substrate.

14 Claims, 3 Drawing Sheets

(52) U.S. Cl.
CPC ........ *H01L 27/1288* (2013.01); *G02F 1/1333* (2013.01); *G02F 1/1368* (2013.01); *G02F 2001/13685* (2013.01); *G02F 2001/133302* (2013.01)

(56) References Cited

FOREIGN PATENT DOCUMENTS

| | | |
|---|---|---|
| CN | 103545170 A | 1/2014 |
| CN | 105161542 A | 12/2015 |
| CN | 106298803 A | 1/2017 |
| WO | 2017/163924 A1 | 9/2017 |

\* cited by examiner

THIN-FILM TRANSISTOR ARRAY SUBSTRATE AND METHOD OF MANUFACTURING THE SAME, AS WELL AS DISPLAY DEVICE

RELATED APPLICATIONS

The present application is a National Phase of International Application Number PCT/CN2017/112062, filed Nov. 21, 2017, and claims the priority of China Application No. 201711045672.4, filed Oct. 31, 2017.

FIELD OF THE DISCLOSURE

The present invention relates to the field of display technologies, and in particular, to a thin film transistor array substrate and a method for fabricating the same, and to a display device including the thin film transistor array substrate.

BACKGROUND

Flat panel display has many advantages such as thin body, power saving, no radiation, and has been widely used. The existing flat panel display devices mainly include a liquid crystal display (LCD) and an organic light emitting display (OLED). A thin film transistor (TFT) array is an important part of a flat panel display device and can be formed on a glass substrate or a plastic substrate, so as to function as a light-open device and a driving device used in an LCD or OLED for example.

FIG. 1 is a schematic structural diagram of a typical conventional thin film transistor array substrate. As shown in FIG. 1, the thin film transistor array substrate comprises a base substrate 1, a buffer layer 2, an active layer 3, a gate insulating layer 4, a gate layer 5, an interlayer dielectric layer 6, a source/drain layer 7, a planarization layer 8, and a pixel electrode layer 9. The thin film transistor is mainly composed of the active layer 3, the gate insulating layer 4, the gate layer 5, the interlayer dielectric layer 6 and the source/drain layer 7. In order to prevent affection to the performance of the thin film transistor due to ions contained in the base substrate or water and oxygen generated during a manufacturing process, as shown in FIG. 1, the buffer layer 2 is provided on the base substrate 1 first, and then each layer of the thin film transistor is formed on the buffer layer 2. A high density $SiN_x$ is used as the material of the buffer layer 2, but it results in a loss of transmittance of the array substrate.

With an increase of the resolution of the display, the traditional methods to improve the transmittance or brightness of the display panel by means of improving an aperture ratio, a color-resist transmittance, backlight brightness, liquid crystal efficiency and the like, have gradually faced bottlenecks. How to improve the transmittance rate of the array substrate without reducing electrical performance becomes a key technical problem.

SUMMARY

In view of the above, the present invention provides a thin film transistor array substrate and a method for fabricating the same. By means of improving a engaging interface between the substrate and the buffer layer in the array substrate, the light transmittance of the array substrate is effectively improved.

In order to achieve the above object, the present invention provides a thin film transistor array substrate comprising a glass substrate, as well as a buffer layer and a pixel structure layer disposed on a first surface of the glass substrate. A plurality of patterned three-dimensional microstructures are formed on the first surface of the glass substrate. The buffer layer and the first surface are mutually meshed.

Moreover, toward a height direction of the three-dimensional microstructure, a cross-section area of the three-dimensional microstructure gradually decreases.

The three-dimensional microstructure is a conical structure or a truncated cone structure.

Furthermore, a height of the three-dimensional microstructure is H, a diameter of a bottom of the three-dimensional microstructure is R1, and a diameter of a top of the three-dimensional microstructure is R2; wherein 100 nm≤R1≤500 nm, 100 nm≤R1≤400 nm, 0≤R2<400 nm, and R2<R1.

A duty ratio of the three-dimensional microstructure is represented by k and 0.3≤k≤1; wherein the duty ratio is defined as k=R1/L, and L refers to a pitch between two bottom centers of two adjacent three-dimensional microstructures.

The material of the buffer layer is $SiN_x$.

The pixel structure layer includes a plurality of conductive layers and an insulating interlayer disposed between any two conductive layers. The material of the insulating interlayer is $SiO_x$.

The plurality of three-dimensional microstructures are arranged in a regular array on the first surface.

The present invention further provides a method for manufacturing the thin film transistor array substrate as described above, which comprises steps of:

S1, providing a glass substrate formed with a first surface containing a plurality of patterned three-dimensional microstructures;

S2, forming a buffer layer on the first surface such that the buffer layer fills into the gaps of the three-dimensional microstructures and covers the three-dimensional microstructures so as to mesh with the first surface; and S3, forming a pixel structure layer on the buffer layer.

Specifically, the step of S1 comprises a step of S11, preparing a porous alumina template having a concave-convex structure by using an anodic oxidation process; a step of S12, forming a photoresist layer on the glass substrate and transferring the pattern of the porous alumina template to the photoresist layer by using an imprinting process so as to form a photoresist mask; and a step of S13, etching the surface of the glass substrate, under the protection of the photoresist mask, to form the first surface containing a plurality of patterned three-dimensional microstructures.

Another aspect of the present invention is to provide a display device including the thin film transistor array substrate as described above.

In the thin film transistor array substrate provided in the embodiments of the present invention, the engaging interface between the base substrate and the buffer layer in the array substrate is improved. Specifically, a plurality of patterned three-dimensional microstructures are provided in the engaging interface between the base substrate and the buffer layer. That is, a moth eye conical structure is formed. The engaging interface between the base substrate and the buffer layer thus forms a structure having a gradual refractive index gradient, which reduces the reflection of the light by the engaging interface and effectively improve the light transmittance of the array substrate.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

Figure 1:
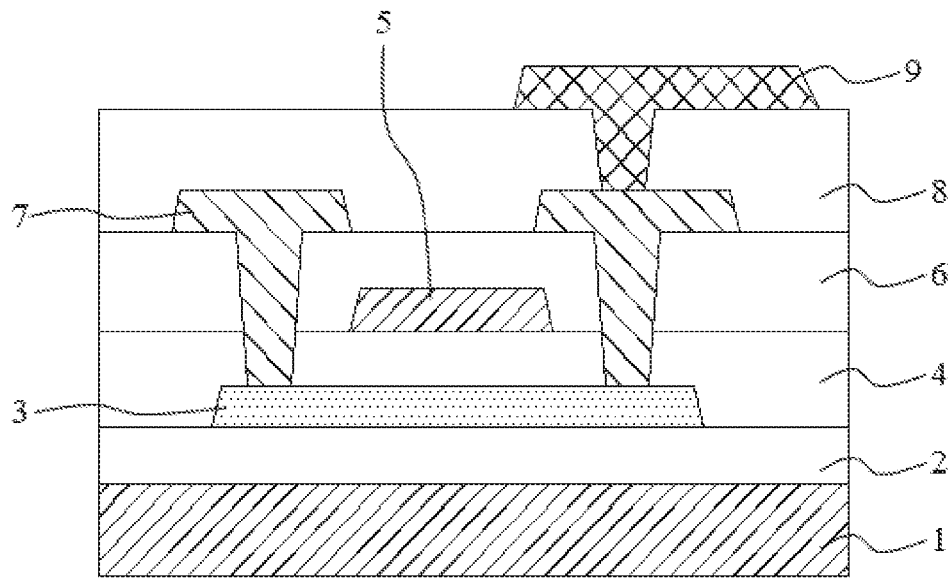
FIG. 1 is a schematic structural view of a conventional thin film transistor array substrate.

The specific structural and functional details disclosed herein are only representative and are intended for describing exemplary embodiments of the disclosure. However, the disclosure can be embodied in many forms of substitution, and should not be interpreted as merely limited to the embodiments described herein.

Here, it should also be noted that in order to avoid obscuring the present invention by unnecessary details, only the structures and/or processing steps that are closely related to the solutions according to the present invention are shown in the drawings, and other details that are little relevant to the present invention are omitted.

In this embodiment of the present invention, a thin film transistor array substrate is provided. As shown in FIG. 1, the thin film transistor array substrate according to this embodiment of the present invention includes a glass substrate 10, a buffer layer 20 disposed on the first surface 10a of the glass substrate 10, and a pixel structure layer 30.

In this embodiment, the material of the buffer layer 20 is $SiN_x$. A high-density $SiN_x$ is used as the material of the buffer layer 20, which can prevent the ions contained in the glass substrate 10 or water and oxygen generated in the manufacturing process from adversely affecting the performance of the thin film transistor. Furthermore, in some other embodiments, an additional layer of $SiO_x$ may further be disposed on the $SiN_x$ layer, and the $SiN_x$ layer and the $SiO_x$ layer jointly form the buffer layer.

Figure 2:
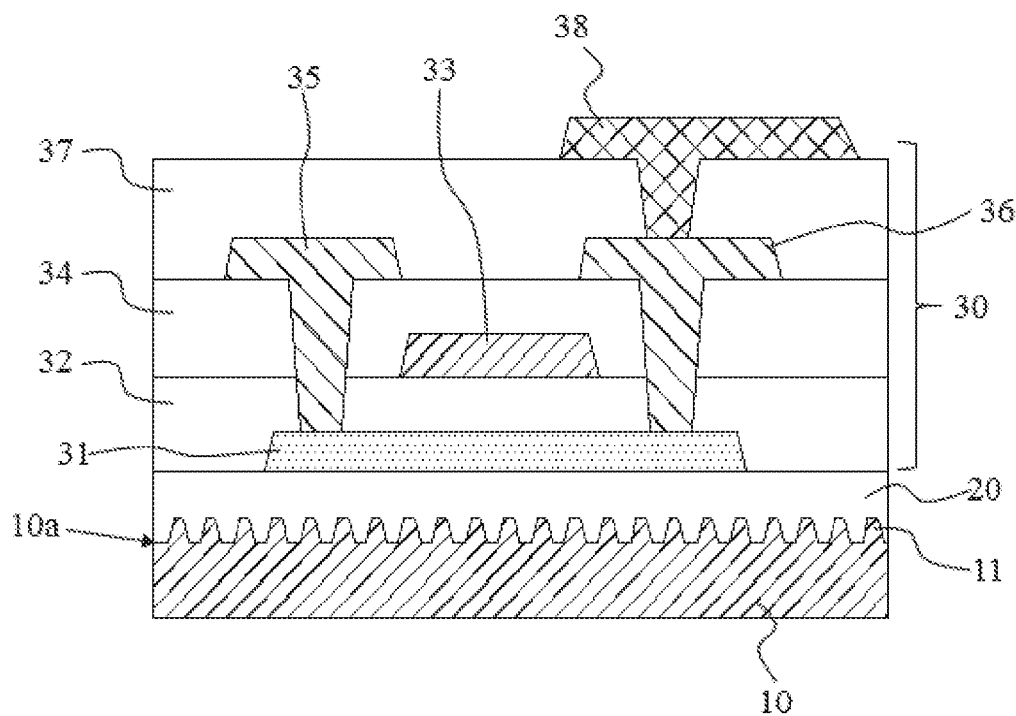
FIG. 2 is a schematic structural view of a thin film transistor array substrate provided in an embodiment of the present invention.
Figure 3:
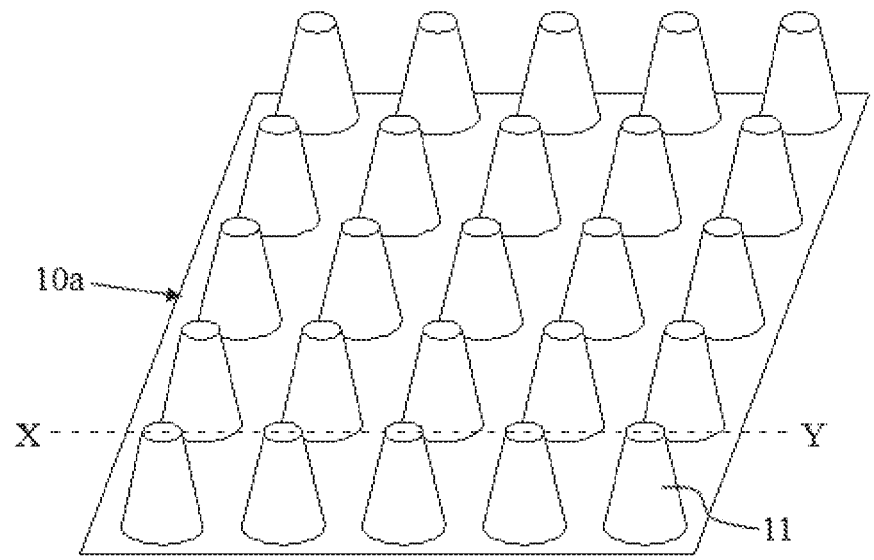
FIG. 3 is a schematic structural view of a three-dimensional micro-structure in an embodiment of the present invention.

In this embodiment, referring to FIG. 2 and FIG. 3, a plurality of patterned three-dimensional microstructures 11 are formed on the first surface 10a of the glass substrate 10. The buffer layer 20 and the first surface 10a are mutually-meshed. That is to say, the buffer layer 20 fills the gaps of the three-dimensional micro-structures 11 and covers the three-dimensional micro-structures 11 so that the buffer layer 20 and the first surface 10a are closely engaged. Specifically, toward a height direction of the three-dimensional micro-structure 11, the cross-sectional area of the three-dimensional micro-structure 11 gradually decreases, and the cross-sectional area of the $SiN_x$ material correspondingly filled between two adjacent three-dimensional microstructures 11 is gradually increased. In the structure mentioned above, a moth-eye taper structure is formed by providing the plurality of patterned three-dimensional microstructures 11 in the engaging interface between the glass substrate 10 and the buffer layer 20, thereby making the engaging interface between the glass substrate 10 and the buffer layer 20 formed with a structure having a gradual refractive index, which reduces the reflection of light by the engaging interface and effectively improves the light transmittance of the array substrate.

Figure 4:
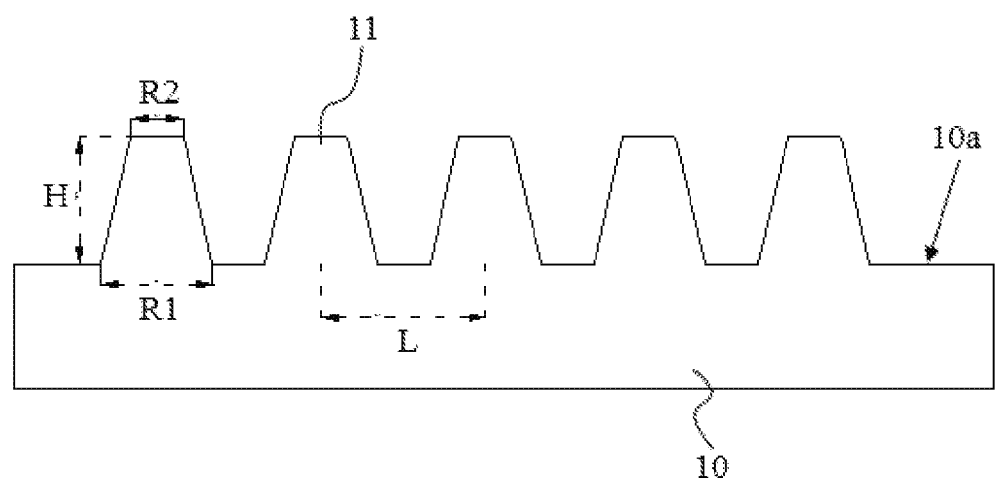
FIG. 4 is a cross-sectional view taken along line X-Y in FIG. 3.

Specifically, in this embodiment, referring to FIG. 3 and FIG. 4, the three-dimensional micro-structure 11 is a truncated cone structure. The height of the three-dimensional micro-structure 11 is H, the diameter of the bottom of the three-dimensional micro-structure 11 is R1, and the diameter of the top of the three-dimensional micro-structure 11 is R2, wherein 100 nm≤R1≤500 nm, 100 nm≤R1≤400 nm, 0≤R2<400 nm, and R<R1. It should be noted that the diameter R2 of the top of the three-dimensional micro-structure 11 is preferably set to 0, and in such a case, the three-dimensional micro-structure 11 is a conical structure. It should be noted that only a few of the three-dimensional microstructures 11 are shown as an example in FIG. 3 and FIG. 4.

Further, the duty ratio of the three-dimensional microstructure 11 is represented by k, and 0.3≤k≤1. The duty ratio is defined as k=R1/L, where L refers to a distance between the bottom center points of two adjacent three-dimensional microstructures 11.

In a preferred embodiment, the plurality of three-dimensional microstructures 11 are arranged in a regular array on the first surface 10a.

The pixel structure layer 30 includes a plurality of conductive layers and an insulating interlayer disposed between any two conductive layers. Specifically, as shown in FIG. 1, the pixel structure layer 30 includes an active layer 31 formed on the buffer layer 20, a gate insulation layer 32 overlying the active layer 31, a gate electrode 33 formed on the gate insulating layer 32, a dielectric interlayer 34 overlying the gate electrode 33, a source electrode 35 and a drain electrode 36 formed on the dielectric interlayer 34, a planarization layer 37 on the source electrode 35 and the drain electrode 36, and a pixel electrode 38 formed on the planarization layer 37. The plurality of conductive layers include the active layer 31, the gate electrode 33, the source electrode 35 and the drain electrode 36, and the pixel electrode 38 and the like as described above. The insulating interlayers include the gate insulating layer 32, the dielectric interlayer 34, and the planarization layer 37 and the like. Furthermore, in the thin film transistor array substrate, the plurality of conductive layers further include some conductive structures not shown in FIG. 2, such as data lines and scan lines. And, the insulating interlayer may also include other insulating layer structures not shown in FIG. 2 for spacing two conductive layers.

In addition, in the pixel structure layer 30 as described above, the active layer 31, the gate electrode 33, the source electrode 35, and the drain electrode 36 constitute the functional components of the thin film transistor. In addition, as shown in FIG. 2, the thin film transistor provided in this embodiment adopts a top-gate thin film transistor. In some other embodiments, a thin film transistor with a bottom gate structure may also be used.

Furthermore, in order to obtain a higher light transmittance of the thin film transistor array substrate, $SiO_x$ is selected as the material of the insulating interlayer in the pixel structure layer 30.

Figure 5:
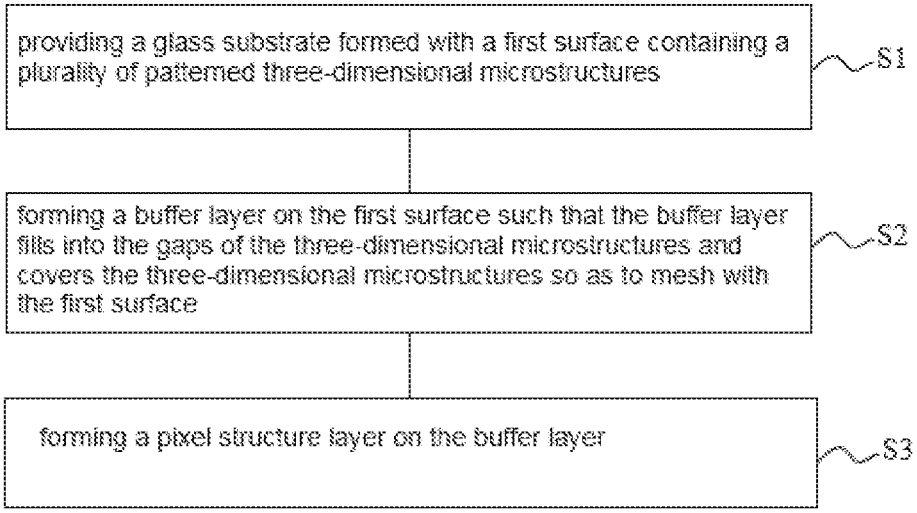
FIG. 5 is a process flow diagram of a method for preparing a thin film transistor array substrate provided in an embodiment of the present invention.

The method for manufacturing the thin film transistor array substrate as described above is introduced as follows. As shown in FIG. 5, the manufacturing method comprises the following steps of S1 to S3.

Figure 6:
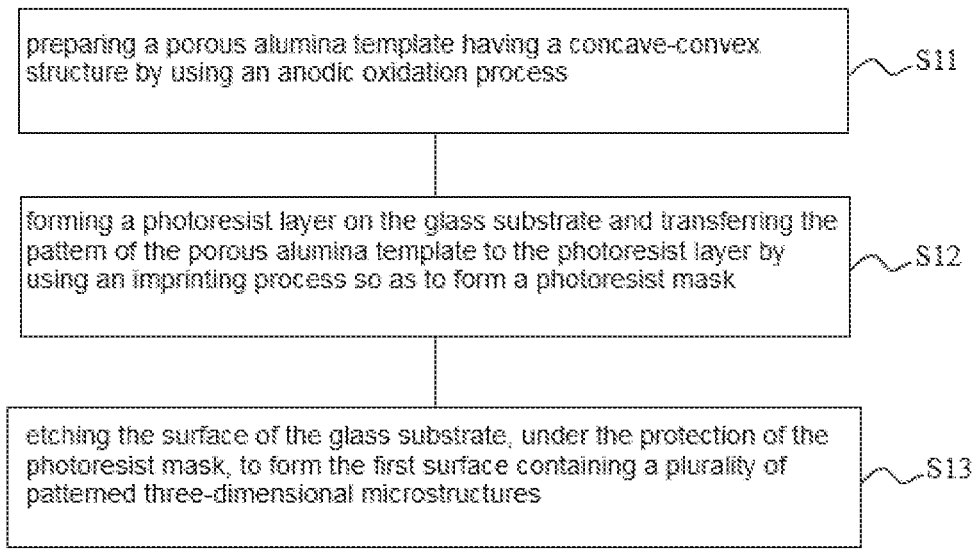
FIG. 6 is a process flow diagram for forming a plurality of patterned three-dimensional microstructures in an embodiment of the present invention.

In step of S1, it is to provide a glass substrate formed with a first surface containing a plurality of patterned three-dimensional microstructures. Referring to FIG. 6, a process for preparing the patterned three-dimensional micro-structure includes the following steps of S11 to S13.

In step of S11, a porous alumina template having a concave-convex structure is prepared by an anodic oxidation process. Specifically, an electrochemical reaction platform is set up, wherein the electrolyte in that platform adopts oxalic acid or sulfuric acid and the like, and aluminum and carbon electrodes are used as the anode and the cathode, respectively. By means of applying a direct-current voltage, the surface of the aluminum electrode is formed into a porous structure. Next, by means of putting the aluminum electrode into a phosphoric acid solution, the diameter of the porous structure becomes increased and the depth also becomes increased due to the oxidation reaction of phosphoric acid, because of the larger specific surface area at the porous structure. Repeating the electrochemical and phosphoric acid oxidation processes described above allows the diameter and depth of the porous aluminum to reach a desired nano-meter level imprint template, so as to form a porous alumina template.

In step of S12, a photoresist layer is coated on the glass substrate. By means of an imprinting process, the pattern of the porous alumina template is transferred to the photoresist layer to form a photoresist mask. The imprinting process may be a roll-to-roll nano-imprint process.

In step of S13, the surface of the glass substrate under the protection of the photoresist mask is etched to form the first surface containing a plurality of patterned three-dimensional microstructures. The etching process uses a wet etching process.

In step of S2, a buffer layer is formed on the first surface, which fills the gaps of the three-dimensional microstructures and covers the three-dimensional microstructures so as to mesh with the first surface. The buffer layer may be formed by a plasma enhanced chemical vapor deposition (PECVD) process.

In step of S3, a pixel structure layer is formed on the buffer layer. As described above, the pixel structure layer includes a plurality of conductive layers and insulating interlayers respectively located between any two conductive layers. The detailed structure of each structural layer in the pixel structure layer and the manufacturing process thereof can take reference to current technology.

Figure 7:
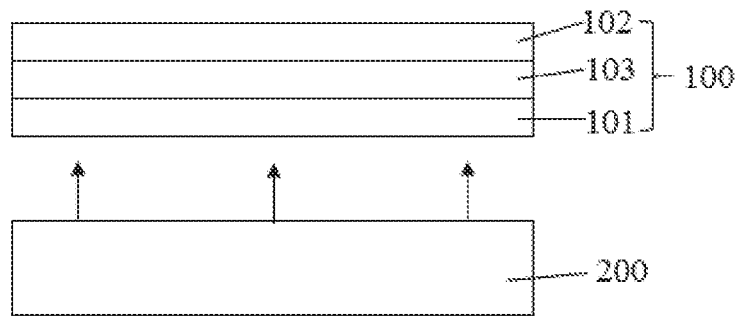
FIG. 7 is a schematic structural diagram of a display device according to an embodiment of the present invention.

This embodiment further provides a display device, in which the thin film transistor array substrate provided by this embodiment of the present invention is used. The display device may be, for example, a liquid crystal display device (LCD) or an organic electroluminescence display device (OLED). By adopting the thin film transistor array substrate provided by this embodiment of the present invention, the display device can have more excellent light transmittance and improve display quality of the display device. Specifically, as shown in FIG. 7 and taking LCD as an example, the liquid crystal display device includes a liquid crystal panel 100 and a backlight module 200. The liquid crystal panel 100 is disposed opposite to the backlight module 200, and the backlight module 200 provides light source to the liquid crystal panel 100 so that the liquid crystal panel 100 displays an image. The liquid crystal panel 100 includes an array substrate 101 and a filter substrate 102 opposite to each other, as well as a liquid crystal layer 103 between the array substrate 101 and the filter substrate 102. The array substrate 101 uses the thin film transistor array substrate provided by the embodiment of the present invention.

In summary, in the thin film transistor array substrate provided by the embodiments of the present invention, the engaging interface between the base substrate and the buffer layer in the array substrate is improved. Specifically, a plurality of patterned three-dimensional microstructures are provided in the engaging interface between the base substrate and the buffer layer, and thus a moth eye film conical structure is formed therebetween. Thereby, the engaging interface of the base substrate and the buffer layer forms a structure having a gradual refractive index, which reduces the reflection of light by the engaging interface, and effectively improves the light transmittance of the array substrate.

It should be noted that, in this document, relational terms such as first and second are merely used to distinguish one entity or operation from another entity or operation, and do not necessarily require or imply that the entity or operation is limited in any such actual relationship or order. Moreover, the terms "include," "comprise," or any other variations thereof are intended to cover a non-exclusive inclusion such that a process, method, article, or apparatus that includes a list of elements includes not only those elements but also non-listed other elements that are inherent to such process, method, article, or device. Without further limitations, an element limited by the statement of "including a . . . " does not exclude the existence of additional identical elements in the process, method, article, or apparatus that includes said element.

The above descriptions are merely specific implementation manners of the present application. It should be noted that those skilled in the art may make some improvements and modifications without departing from the principle of the present application. These improvements and modifications also be regarded as the scope of protection of this application.

The above is only the embodiments of the present invention, and does not intend to limit the scope of the present invention. All equivalent structures or equivalent process changes made by using the present specification and the accompanying drawings as well as direct or indirect use in other related technologies are all included in the scope of the patent protection of the present invention.

What is claimed is:

1. A thin film transistor array substrate, comprising a glass substrate, a buffer layer and a pixel structure layer disposed on a first surface of the glass substrate, wherein the first surface of the glass substrate are patterned and formed a plurality of three-dimensional microstructures on the first surface of the glass substrate, and the buffer layer and the first surface are mutually intermeshed, and wherein the pixel structure layer includes a gate electrode disposed on the buffer layer and a pixel electrode disposed on the gate electrode, and the three-dimensional microstructures are correspond to the gate electrode and the pixel electrode.

2. The thin film transistor array substrate as claimed in claim 1, wherein toward a height direction of the three-dimensional microstructure, a cross-section area of the three-dimensional microstructure gradually decreases.

3. The thin film transistor array substrate as claimed in claim 2, wherein the three-dimensional microstructure is a conical structure or a truncated cone structure.

4. The thin film transistor array substrate as claimed in claim 3, wherein a height of the three-dimensional microstructure is H, a diameter of a bottom of the three-dimensional microstructure is R1, and a diameter of a top of the three-dimensional microstructure is R2; and wherein 100 nm≤R1≤500 nm, 0≤R2<400 nm, and R2<R1.

5. The thin film transistor array substrate as claimed in claim 4, wherein a duty ratio of the three-dimensional microstructure is represented by k and 0.3≤k≤1; and wherein the duty ratio is defined as k=R1/L, where L refers to a pitch between two bottom centers of two adjacent three-dimensional microstructures.

6. The thin film transistor array substrate as claimed in claim 1, wherein a material of the buffer layer is $SiN_x$, the pixel structure layer includes a plurality of conductive layers and an insulating interlayer disposed between any two conductive layers, and a material of the insulating interlayer is $SiO_x$.

7. The thin film transistor array substrate as claimed in claim 1, wherein the plurality of three-dimensional microstructures are arranged in a regular array on the first surface.

8. A display device, including a thin film transistor array substrate, wherein the thin film transistor array substrate comprises a glass substrate, a buffer layer and a pixel structure layer disposed on a first surface of the glass substrate, and wherein the first surface of the glass substrate are patterned and formed a plurality of three-dimensional microstructures on the first surface of the glass substrate, and the buffer layer and the first surface are mutually meshed, and wherein the pixel structure layer includes a gate electrode disposed on the buffer layer and a pixel electrode disposed on the gate electrode, and the three-dimensional microstructures are correspond to the gate electrode and the pixel electrode.

9. The display device as claimed in claim 8, wherein toward a height direction of the three-dimensional microstructure, a cross-section area of the three-dimensional microstructure gradually decreases.

10. The display device as claimed in claim 9, wherein the three-dimensional microstructure is a conical structure or a truncated cone structure.

11. The display device as claimed in claim 10, wherein a height of the three-dimensional microstructure is H, a diameter of a bottom of the three-dimensional microstructure is R1, and a diameter of a top of the three-dimensional microstructure is R2; and wherein 100 nm≤R1≤500 nm, 0≤R2<400 nm, and R2<R1.

12. The display device as claimed in claim 11, wherein a duty ratio of the three-dimensional microstructure is represented by k and 0.3≤k≤1; and wherein the duty ratio is defined as k=R1/L, where L refers to a pitch between two bottom centers of two adjacent three-dimensional microstructures.

13. The display device as claimed in claim 8, wherein a material of the buffer layer is $SiN_x$, the pixel structure layer includes a plurality of conductive layers and an insulating interlayer disposed between any two conductive layers, and a material of the insulating interlayer is $SiO_x$.

14. The display device as claimed in claim 8, wherein the plurality of three-dimensional microstructures are arranged in a regular array on the first surface.

* * * * *